(12) United States Patent
Quick et al.

(10) Patent No.: US 8,617,669 B1
(45) Date of Patent: Dec. 31, 2013

(54) LASER FORMATION OF GRAPHENE

(75) Inventors: Nathaniel R. Quick, Lake Mary, FL (US); Aravinda Kar, Oviedo, FL (US)

(73) Assignee: Partial Assignment to University of Central Florida

( * ) Notice: Subject to any disclaimer, the term of this patent is extended or adjusted under 35 U.S.C. 154(b) by 169 days.

(21) Appl. No.: 12/928,229

(22) Filed: Dec. 7, 2010

Related U.S. Application Data

(60) Continuation-in-part of application No. 12/924,965, filed on Oct. 8, 2010, which is a division of application No. 11/407,738, filed on Apr. 20, 2006, now Pat. No. 7,811,914.

(60) Provisional application No. 61/283,711, filed on Dec. 8, 2009.

(51) Int. Cl.
  *C23C 8/00* (2006.01)
  *C23C 16/00* (2006.01)

(52) U.S. Cl.
  USPC ............... 427/586; 427/249.1; 427/248.1

(58) Field of Classification Search
  USPC .................... 427/586, 249.1, 248.1
  See application file for complete search history.

(56) References Cited

U.S. PATENT DOCUMENTS

| | | | |
|---|---|---|---|
| 3,214,315 A | 10/1965 | Hildebrand |
| 3,396,401 A | 8/1968 | Nonomura |
| 3,419,321 A | 12/1968 | Barber et al. |
| 3,605,469 A | 9/1971 | Queralto |
| 3,788,120 A | 1/1974 | Takeo et al. |
| 3,854,123 A | 12/1974 | Banach |
| 3,865,564 A | 2/1975 | Jaeger et al. |
| 3,874,240 A | 4/1975 | Rembaum |
| 3,943,324 A | 3/1976 | Haggerty |
| 3,944,640 A | 3/1976 | Haggerty et al. |
| 3,945,318 A | 3/1976 | Landsman |
| 3,965,328 A | 6/1976 | Locke |
| 3,981,705 A | 9/1976 | Jaeger et al. |
| 4,043,170 A | 8/1977 | Erodi et al. |
| 4,135,902 A | 1/1979 | Oehrle |
| 4,142,088 A | 2/1979 | Hirsch |
| 4,159,414 A | 6/1979 | Suh et al. |
| 4,215,263 A | 7/1980 | Grey et al. |
| 4,309,224 A | 1/1982 | Shibata |
| 4,339,285 A | 7/1982 | Pankove |
| 4,372,989 A | 2/1983 | Menzel |

(Continued)

FOREIGN PATENT DOCUMENTS

| | | |
|---|---|---|
| GB | WO 03013757 | 2/2000 |
| JP | 358095830 A | 6/1983 |
| JP | 405024975 A | 2/1993 |

OTHER PUBLICATIONS

Cappelli et al. Laser annealing of amorphous carbon films, Oct. 2008, Applied Surface Science, 255, 99 5620-5625.*

(Continued)

*Primary Examiner* — Kelly M Gambetta
(74) *Attorney, Agent, or Firm* — Frijouf, Rust & Pyle P.A.

(57) ABSTRACT

An apparatus and method is disclosed for synthesizing graphene comprising the steps of providing a substrate and focusing a laser beam in the presence of a carbon doping gas to induce photolytic decomposition of the gas to atomic carbon. The carbon is photolytically reacted with the substrate to grow graphene.

9 Claims, 11 Drawing Sheets

(56) References Cited

U.S. PATENT DOCUMENTS

| | | | |
|---|---|---|---|
| 4,383,843 A | 5/1983 | Iyengar | |
| 4,496,607 A | 1/1985 | Mathias | |
| 4,539,251 A | 9/1985 | Sugisawa et al. | |
| 4,547,650 A | 10/1985 | Arditty et al. | |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Bauerle | |
| 4,691,091 A | 9/1987 | Lyons et al. | |
| 4,710,253 A | 12/1987 | Soszek | |
| 4,761,339 A | 8/1988 | Komatsu et al. | |
| 4,791,239 A | 12/1988 | Shirahata et al. | |
| 4,840,853 A | 6/1989 | Lio et al. | |
| 4,847,138 A | 7/1989 | Boylan et al. | |
| 4,860,442 A | 8/1989 | Ainsworth et al. | |
| 4,872,923 A | 10/1989 | Borodin | |
| 4,880,770 A | 11/1989 | Mir et al. | |
| 4,901,550 A | 2/1990 | Koide | |
| 4,912,087 A | 3/1990 | Aslam et al. | |
| 4,924,033 A | 5/1990 | Iyogi et al. | |
| 4,950,558 A | 8/1990 | Sarin | |
| 4,962,085 A | 10/1990 | deBarbadillo, II et al. | |
| 4,988,564 A | 1/1991 | D'Angelo et al. | |
| 5,015,618 A | 5/1991 | Levinson | |
| 5,055,967 A | 10/1991 | Sukonnik et al. | |
| 5,063,421 A | 11/1991 | Suzuki et al. | |
| 5,127,364 A | 7/1992 | Savkar et al. | |
| 5,145,741 A | 9/1992 | Quick | |
| 5,149,681 A | 9/1992 | Ohkawa et al. | |
| 5,180,440 A | 1/1993 | Siegel et al. | |
| 5,243,204 A | 9/1993 | Suzuli et al. | |
| 5,336,360 A | 8/1994 | Nordine | |
| 5,391,841 A | 2/1995 | Quick | |
| 5,405,481 A | 4/1995 | Licoppe et al. | |
| 5,416,342 A | 5/1995 | Edmond et al. | |
| 5,459,098 A | 10/1995 | Maya | |
| 5,493,096 A | 2/1996 | Koh | |
| 5,549,971 A | 8/1996 | Nordine | |
| 5,629,532 A | 5/1997 | Myrick | |
| 5,680,200 A | 10/1997 | Sugaya et al. | |
| 5,695,828 A | 12/1997 | Ghosh et al. | |
| 5,733,609 A | 3/1998 | Wang | |
| 5,754,299 A | 5/1998 | Sugaya et al. | |
| 5,793,042 A | 8/1998 | Quick | |
| 5,823,039 A | 10/1998 | Umeda et al. | |
| 5,837,607 A | 11/1998 | Quick | |
| 5,847,418 A | 12/1998 | Nakamura et al. | |
| 5,889,234 A | 3/1999 | Ghosh et al. | |
| 5,906,708 A | 5/1999 | Robinson et al. | |
| 5,961,877 A | 10/1999 | Robinson et al. | |
| 6,025,609 A | 2/2000 | Quick | |
| 6,054,375 A | 4/2000 | Quick | |
| 6,064,081 A | 5/2000 | Robinson et al. | |
| 6,203,861 B1 | 3/2001 | Kar et al. | |
| 6,221,154 B1 | 4/2001 | Lee et al. | |
| 6,252,197 B1 | 6/2001 | Hoekstra et al. | |
| 6,255,671 B1 | 7/2001 | Bojarczuk et al. | |
| 6,271,576 B1 | 8/2001 | Quick | |
| 6,274,234 B1 | 8/2001 | Dujardin et al. | |
| 6,313,015 B1 | 11/2001 | Lee et al. | |
| 6,334,939 B1 | 1/2002 | Zhou et al. | |
| 6,407,443 B2 | 6/2002 | Chen et al. | |
| 6,526,327 B2 | 2/2003 | Kar et al. | |
| 6,621,448 B1 | 9/2003 | Lasky et al. | |
| 6,670,693 B1 | 12/2003 | Quick | |
| 6,732,562 B2 | 5/2004 | Quick et al. | |
| 6,900,465 B2 | 5/2005 | Nakamura et al. | |
| 6,930,009 B1 | 8/2005 | Quick | |
| 6,939,748 B1 | 9/2005 | Quick | |
| 6,998,690 B2 | 2/2006 | Nakamura et al. | |
| 7,045,375 B1 | 5/2006 | Wu et al. | |
| 7,237,422 B2 | 7/2007 | Quick | |
| 7,268,063 B1 | 9/2007 | Quick | |
| 7,419,887 B1 | 9/2008 | Quick | |
| 7,630,147 B1 | 12/2009 | Kar et al. | |
| 7,811,914 B1 | 10/2010 | Quick et al. | |
| 7,897,492 B2 | 3/2011 | Quick | |
| 2009/0321860 A1* | 12/2009 | Klostermann et al. | 257/421 |

OTHER PUBLICATIONS

Nathaniel R. Quick, Laser Conversion of Ceramic Materials to Eiectroconductors, international Conference on Electronic Materials-1990, Materials Research Society, Newark, New Jersey, Sep. 17-19, 1990.

Nathaniel R. Quick, Direct Conversion of Conductors on Ceramic Substrates, International Society for Hybrid Microelectronics, ISHM 90 Proceedings 1990.

Nathaniel R. Quick and Jeffrey A. Phillips, Laser Processes for Integrating Substrate Fabrication, Proceedings of the International Conference on Lasers '91, The Society for Optical & Quantum Electronics, pp. 537-544 San Diego, CA Dec. 9-13, 1991.

Nathaniel R. Quick and Richard J. Matson, Characterization of a Ceramic Electrical Conductor Synthesized by a Laser Conversion Process, Proceedings of the international Conference on Lasers '91 , The Society for Optical & Quantum Electronics, pp. 545-552 San Diego, CA Dec. 9-13, 1991.

Nathaniel R. Quick, Characterization of a Ceramic Sensor Synthesized by a Laser Conversion Process, Proceedings of the International Conference on Lasers '92, The Society for Optical & Quantum Electronics, pp. 881-887 Houston, Texas Dec. 7-10, 1992.

Nathaniel R. Quick, Characterization of a Ceramic Thermal Sensor Synthesized by a Laser Conversion Process, ICALEC '92 (International Congress on Applications of Lasers and Electra-Optics), vol. 75 Laser Materials Processing, Laser Institute of America, pp. 394. 404 Oct. 25-29, 1992.

D. K. Sengupta, N. R. Quick and A. Kar, Laser Direct Write of Conducting and Insulating Tracks in Silicon Carbide, Materials Research Society Symposium Proceedings vol. 624 pp. 1 27-1 33 2000.

D. K. Sengupta, N. R. Quick and A. Kar, Laser Conversion of Electrical Properties to Silicon Carbide Device Applications, Journal of Laser Applications., 2001, vol. 13, pp. 26-31.

I.A. Salama, N. R. Quick And A. Kar, Laser Doping of Silicon Carbide Substrates, Journal of Electronic Materials, vol. 31, 2002, pp. 200-208.

I.A. Salama, N. R. Quick and A. Kar, Microstructuraland electrical resistance analysis of laser-processed SiC substrates for wide bandgep semiconductor materials, Journal of Materials Science, vol. 40, 2005, pp. 3969-3980.

I.A. Salama, N. R. Quick and A. Kar, Laser Synthesis of Carbon-Rich SiC Nanoribbons, Journal of Applied Physics, vol. 93, 2003, pp. 9275-9281.

I.A. Salama, N.R. Quick and A. Kar, Laser Direct Write Doping of Wide-Bandgap Semiconductor Materials, IEEE ISCS 2003 Proceedings.

A. Salama, C. F. Middleton, N. R. Quick G. D. Boreman and A. Kar, Laser-Metallized Silicon Carbide Schottky Diodes for Millimeter Wave Detection and Frequency Mixing, Symposium N1 Nitride and Wide Bandgap Semiconductors for Sensors, Photonics and Electronics IV. 204th Meeting of the Electrochemical Society, Orlando, Florida Oct. 12-16, 2003.

A. Salama, N. R. Quick and A. Kar, Laser Direct Metallization of Silicon Carbide without Metal Deposition, Symposium C, New Applications for Wide Bandgap Semiconductors, Materials Research Society, Apr. 23-24 2003.

I. A. Salama, N. R. Quick and A. Kar, Laser-induced Dopant Incorporation in Wide Bandgap Materials: SiC and GaN, ICALEO 2003 (International Congress on Applications of Lasers and Electro-Optics) Proceedings, 2003.

I.A. Salama, N. R. Quick, and A. Kar, Laser Direct Writing and Doping of Diamond-like Carbon, Polycrystalline Diamond and Single Crystal Silicon Carbide, Journal of Laser Applications. vol. 16, 2004, pp. 92-99.

Z. Tian;, N. R. Quick and A. Kar, Laser Direct Write and Gas Immersion Laser Doping Fabrication of SiC Diodes, J; Silicon Carbide Materials, Procesing and Devices, Symposium J Apr. 14-15, 2004.

(56) References Cited

OTHER PUBLICATIONS

Z. Tian, N. R. Quick and A. Kar, Laser Doping of Silicon Carbon and PIN Diode Fabrication, 23rd international Congress on Applications of Lasers & Electro-Optics 2004.

A. Kar and N. R. Quick, Laser Processing for Wide Bandgap Semiconductor Device Fabrication, 2004 Meeting of Optical Society of America, 2004.

Z. Tian, I.A. Salama, N. R. Quick and A. Kar, Effects of Different laser Sources and Doping Methods used to Dope Silicon Carbide, Acta Materialia, vol. 53, 2005, pp. 2935-2844.

I.A. Salama. N. R. Quick and A. Kar. Microstructural and electrical resistance analysis of laser-processed SiC substrates for wide bandgap semiconductor materials, Journal of Materials Science, vol. 40, 2005, pp. 3969-3980.

Z. Tian, N. R. Quick and A. Kar, Characteristics off 6H-Silicon Carbide PIN Diodes Prototyping by Laser Doping, Journal of Electronic Materials, vol. 34, 2005, pp. 430-438.

Chong Zhang, A. Salama, N. R. Quick and A. Kar, Two-Dimensional Transient Modeling of CO2 Laser Drilling of Microvias in High Density Flip Chip Substrates, ICALEO 2005 (International Congress on Applications of Lasers and Electro-Optics), Laser Institute of America, Oct. 31—Nov. 3, 2005.

Chong Zhang, S. Bet, A. Salwa, N. R. Quick and A. Kar, CO2 Laser Drilling of Microuras Using Diffractive Optics Techniques. I Mathermatical Modeling, InterPack 05, the ASME/Pacific Rim Technical Conference on integration and Packaging of MEMS, NEMS and Electronic Systems, San Francisco, CA duly 17-22, 2005.

Z. Tian, N. R. Quick and A. Kar, Laser Synthesis of Optical Structures in Silicon Carbide, 207th Meeting of the Electrochemical Society Proceedings, May 15-20, 2005.

Z. Tian, N. R. Quick and A. Kar, Laser-enhanced diffusion of nitrogen and aluminum dopants in silicon carbide, Acta Materiallia, Vol, 54, 2006, pp. 4273-4283.

Z. Tian, N. R. Quick and A. Kar, Laser Direct Write Doping and Metallization Fabrication of Silicon Carbide PIN Diodes, Materials Science Forum, vols. 527-529, 2006, pp. 823-826.

S. Dakshinamurthy, N. R. Quick and A. Kar, SiC-based Optical Interferometry at high pressures and temperatures for pressure and chemical sensing, Journal of Applied Physics, vol, 99, 2006, pp. 094902-1 to 094902-8.

C. Zhang, A. Salama, N. R. Quick and A. Kar, Modelling of Microvia Drilling with a Nd:YAG Laser, Journal of Physics D: Applied Physics 39 (2006) 3910-3918.

Z. Tian, N. R. Quick and A. Kar, Laser Endotaxy and PIN Diode Fabrication of Silicon Carbide, 2006 Spring Meting of Materials Research Society, 2006.

Z. Tian, N. R. Quick and A. Kar, Characteristics of Laser-Fabricated Diodes on Endotexial Silicon Carbide Substrates, ESCRM (European Conference on Silicon Carbide and Related Materials) Proceedings 2006.

S. Bet, N.R. Quick and A. Kar, Laser Doping of Chromium and Selenium in p-type 4H-SiC, ICSCRM 2007 Symposium.

N. Quick, Bet and A. Kar, Laser Doping Fabrication of Energy Conversion Device Materials Science and Technology 2007 Conference and Exhibition.

S. Bet, N.R. Quick and A. Kar, Effect of Laser Field and Thermal Stress on Diffusion in Laser Doping of SiC, Acta Materialia 55 (2007) 6816-6824.

S. Bet, N. R. Quick and A. Kar, Laser-Doping of Silicon Carbide for p-n Junction and Led Fabrication, Physica Status Solidi (A), vol. 204, No. 4, 2007, pp. 1147-1157.

S. Dakshinamurthy, N. R. Quick and A. Kar, Temperature-dependent Optical Properties of Silicon Carbide for Wirereless Temperature Sensors. Journal of PhysicsD: Applied Physics 40 (2007)353-360.

S. Dakshnamurthy, N.R. Quick and A. Kar, High temperature optical properties of silicon carbide for wireless thermal sensing, Journal of Physics D: Applied Physics, vol. 40, No. 2. 2007, pp. 353-360.

Chong Zhang, A. Salama, N. R. Quick and A. Kar, Determination of Thermophysical Properties for Polymer Films using Conduction Analysis of Laser Heating, International Journal of Thertnophysics. vol. 28, No. 3, Jun. 2007.

N. R. Quick, S. Bet and A. Kar, Laser Doping Fabrication of Energy Conversion Devices, Materials Science and Technology 2007 Conference and Exhibition, Sep. 19, 2007.

S. Bet, N.R. Quick and A. Kar, Laser Doping of Chromium in 6H-SiC for White Light Emitting Diodes, Laser Institute of America, Journal of Laser Applications vol. 20 No. 1 pp. 43-49 Feb. 2008.

Z. Tian, N. R Quick and A. Kar, Laser Endotaxy in Silicon Carbide and PIN Diode Fabrication, Laser institute of America, Journal of Laser Applications, vol. 20 No. 2 pp. 100-115, May 2000.

I. Salama, N. Quick and A. Kar, Laser Direct Write Doping of Wide-Bandgap Semiconductor Materials, ISCS 2003 Proceedings, 2003.

I. Salama, N. Quick and A. Kar, Laser Microprocessing of Wide Bandgap Materials, Proceedings of International Congress on Laser Advanced Materials Processing (LAMP 2002).

S. Bet, N. Quick and A. Kar, Laser Doping of Chromium and Selenium in P-Type 4H-SiC, Materials Science Forum vols. 600-603 (2009) pp. 627-630.

* cited by examiner

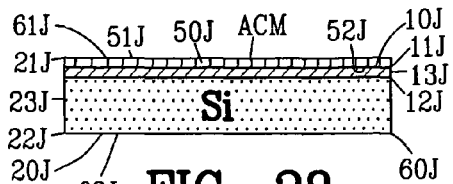
FIG. 28
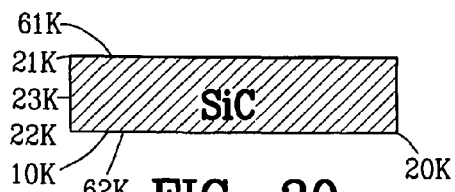
FIG. 30
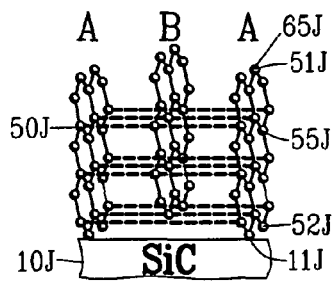
FIG. 29
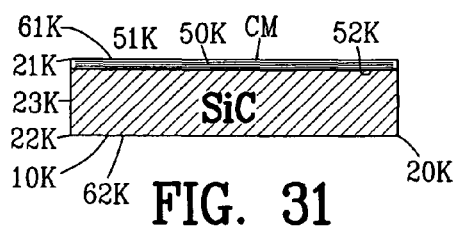
FIG. 31
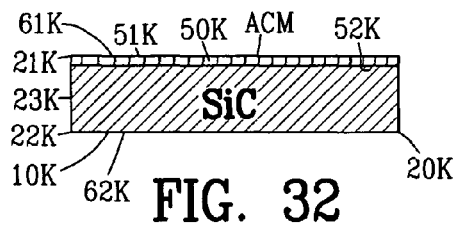
FIG. 32
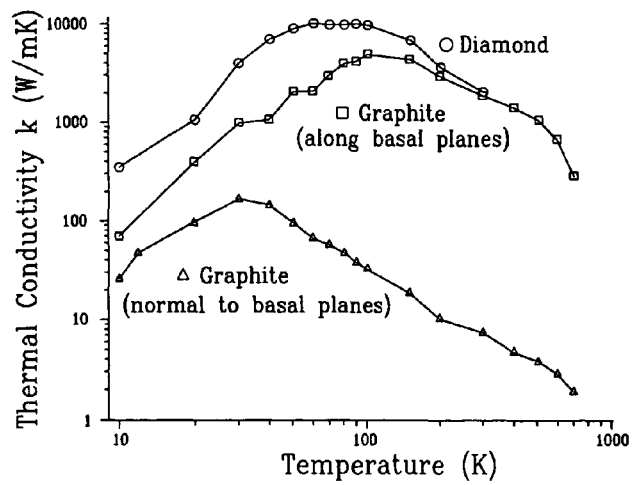
FIG. 33
| Substance | K (w/mK) at 300 K |
|---|---|
| SiC | 490 |
| Ag | 429 |
| Cu | 401 |
| Au | 317 |
| BeO | 260 |
| Al | 237 |
| AlN | 180 |
| Si | 150 |
| $Al_2O_3$ | 40 |
FIG. 34

Graphene islands and interconnects on a substrate for device fabrication.

LASER FORMATION OF GRAPHENE

CROSS-REFERENCE TO RELATED APPLICATIONS

This is a continuation-in-part of U.S. patent application Ser. No. 12/924,965 filed Oct. 8, 2010. U.S. patent application Ser. No. 12/924,965 filed Oct. 8, 2010 is a Divisional patent application Ser. No. 11/407,738 filed Apr. 20, 2006 now U.S. Pat. No. 7,811,914. This application claims benefit to provisional application Ser. No. 61/283,711 filed Dec. 8, 2009. All subject matter set forth in application Ser. No. 12/924,965 and application Ser. No. 11/407,738 and provisional application Ser. No. 61/283,711 filed Dec. 8, 2009 is hereby incorporated by reference into the present application as if fully set forth herein.

BACKGROUND OF THE INVENTION

1. Field of the Invention

This invention relates to solid state devices and methods and more particularly to and apparatus and method of forming graphene on a semiconductor substrates for electrical and photonic devices.

2. Description of the Related Art

Presently, silicon and gallium arsenide are the dominant conventional semiconductor materials used in the manufacture of semiconductor devices. Silicon and gallium arsenide are considered non-wide bandgap semiconductors. In contrast, wide bandgap semiconductors have superior properties including breakdown field, dielectric constant, thermal conductivity and saturated electron drift velocity. Unfortunately, wide bandgap semiconductors are expensive due to high processing costs and poor yields emanating from wafer growth through device packaging.

Ceramic substrates having wide bandgap semiconductor compositions, such as silicon carbide (SiC) and aluminum nitride (AlN), are known to exhibit electrical properties ranging from insulating electrical properties, semiconducting electrical properties and conducting electrical properties.

The wide-bandgap semiconductor phases of ceramics and other wide-bandgap semiconductors including diamond are used to create devices such as conductive tabs, interconnects, vias, wiring patterns, resistors, capacitors, semiconductor devices and the like electronic components by laser synthesis on the surfaces and within the body of such wide-bandgap semiconductors to thereby eliminate photolithography processes which require numerous steps and generate undesirable chemical pollutants when processing such traditional electronic devices, components and circuitry.

It is well known that alumina ($Al_2O_3$) dominates the dielectric market as an integrating substrate or device carrier in electronics packaging. Boron nitride (BN), aluminum nitride (AlN), silicon carbide (SiC) and diamond are also of interest due to the thermal coefficient of expansion (TCE) and for the dielectric constant and higher thermal conductivity than that of aluminum oxide ($Al_2O_3$). Silicon carbide (SiC), aluminum nitride (AlN), boron nitride (BN), gallium nitride (GaN) and diamond also exhibit a wide-band gap and chemical resistance as well as exhibiting properties from a semiconductor to an insulator. These properties are of substantial interest for high temperature applications approaching 1000° C. and for aggressive environment applications. In addition, these properties are desirable for high density integrated circuit packing.

In the prior art, metallization methods, including dry-film imaging and screen printing have been used for the production of conductive patterns on alumina. However, metal compatibility difficulties with high thermal conductivity ceramic materials such as aluminum nitride (AlN) and silicon carbide (SiC), have not been completely solved. Copper and silver paste exhibits a thermal coefficient of expansion (TCE) mismatch aggravated by high temperatures as well as being subject to oxidation that increases the resistivity. In particular, bonding of copper to aluminum nitride (AlN) has proved to be nontrivial. Alumina or stoichiometric aluminum oxynitride (AlON) coatings must be developed on the aluminum nitride (AlN) surface through passivation processes. These passivation processes have poor reproducibility. Thus, the direct laser synthesis of conductors in aluminum nitride (AlN), silicon carbide (SiC) and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

Discussion of wide bandgap materials and the processing thereof are discussed in U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No. 6,271,576, U.S. Pat. No. 6,670,693; U.S. Pat. No. 6,930,009; U.S. Pat. No. 6,939,748; U.S. Pat. No. 7,268,063; U.S. Pat. No. 7,419,887; U.S. Pat. No. 7,618,880 and U.S. Pat. No. 7,811,914 are hereby incorporated by reference into the present application.

Therefore, it is an object of this invention to provide a process for forming graphene on or in a substrate.

Another object of this invention is to provide an improved process for forming graphene on or in a substrate wherein carbon is photolytically reacted with the substrate to grow graphene.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved apparatus and a method for synthesizing graphene, comprising the steps of providing a substrate. A laser beam is focused in the presence of a carbon doping gas to induce photolytic decomposition of the gas to atomic carbon. Continued focusing of the laser beam photolytically react the carbon with the substrate to grow graphene.

In another embodiment, the method comprises the steps of providing a silicon substrate. A laser beam is focused in the presence of a carbon doping gas to induce photolytic decomposition of the gas to atomic carbon. Continued focusing the laser beam photolytically reacts the carbon with the silicon substrate to grow graphene.

Preferably, the laser is a frequency doubled Nd:YAG laser produces a 532 nm wavelength to create two-photon absorption in silicon to limit temperature below the melting point of silicon. The laser radiation-silicon interaction catalyzes the silicon for carbon chemisorption. Ideally, the graphene is limited to 3 planes of hexagonically oriented carbon. The laser beam may be focused on a portion of the silicon substrate to create islands and connecting lines of grapheme on the surface of the silicon substrate.

In a more specific embodiment, the method comprises the steps of providing a silicon substrate transparent to 532 nm wavelength. A top surface of the silicon substrate is immersed in carbon containing doping gas. A 532 nm laser is focused from a bottom surface to the top surface of the silicon substrate to photolytically decompose the carbon on the top surface of the silicon substrate growing graphene on the top surface of the silicon substrate.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 28 is a side sectional view of the substrate of FIG. 27 with the molecular planes of the layer of carbon thermal conducting material being oriented to be generally perpendicular to an external surface of the substrate formed by focusing a thermal energy beam within the layer of carbon thermal conducting material;

FIG. 29 is a magnified view of a portion of FIG. 28 illustrating the orientation of the molecular planes of the carbon thermal conducting material;

FIG. 30 is a side sectional view of a silicon carbide substrate;

FIG. 31 is a side sectional view of the substrate of FIG. 30 with a layer of the silicon carbide material being converted into a carbon thermal conducting material by a thermal energy beam in the presence of a reacting gas;

FIG. 32 is a side sectional view of the substrate of FIG. 31 with the molecular planes of the layer of carbon thermal conducting material being orientated to extend from the substrate formed by focusing a thermal energy beam within the layer of carbon thermal conducting material;

FIG. 33 is a graph of the thermal conductivity of different materials;

FIG. 34 is a list of the thermal conductivity of various materials;

Similar reference characters refer to similar parts throughout the several Figures of the drawings.

DETAILED DISCUSSION

Figure 1:
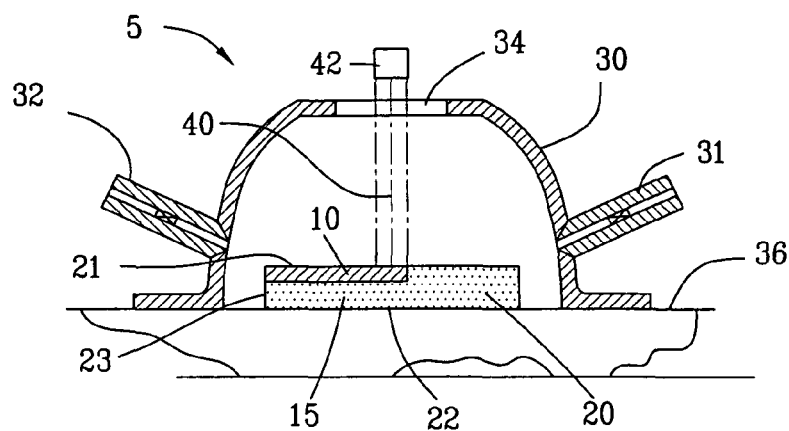
FIG. 1 is a side view of an air-tight chamber with a thermal energy beam impinging on a non-wide bandgap material for forming a layer of a wide bandgap material in the non-wide bandgap material.

FIG. 1 is a side view of an apparatus 5 for forming a layer of a wide bandgap material 10 in a non-wide bandgap material 15. The non-wide-bandgap material 15 is shown as a substrate 20 located in an air-tight chamber 30. The chamber 30 has an inlet and valve combination 31 and outlet and valve combination 32 connected to the side wall of the chamber 30 for injecting and removing gases into and therefrom, respectively. The chamber 30 includes an airtight transmission window 34. The chamber 30 is disposed on a support member 36 forming an airtight seal therewith.

Figure 2:
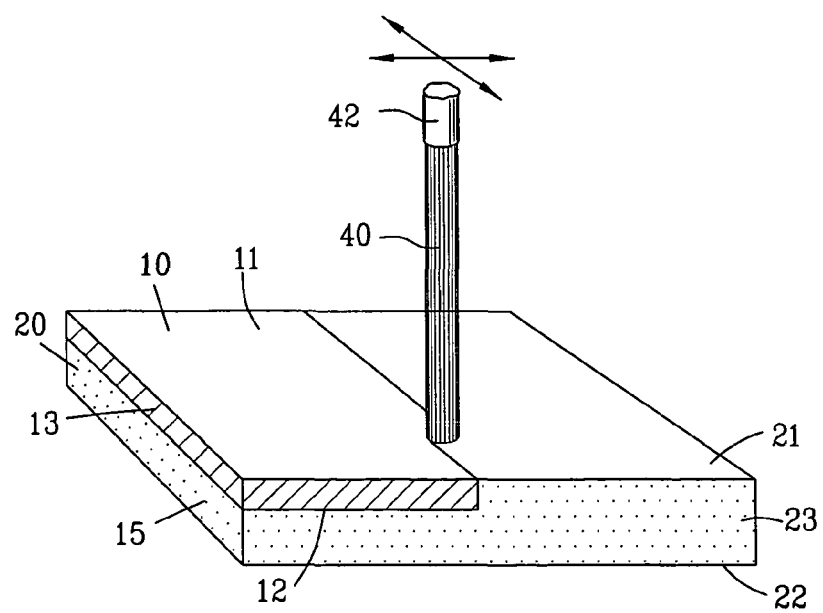
FIG. 2 is an enlarged isometric view of the layer of the wide bandgap material formed in the non-wide bandgap material.

FIG. 2 is an enlarged isometric view of the wide bandgap material 10 formed in the substrate 20 shown in FIG. 1. The wide bandgap material 10 defines a first and a second surface 11 and 12 and a peripheral edge 13. The substrate 20 defines a first and a second surface 21 and 22 and a peripheral edge 23. Although the substrate 20 is shown as a square, the present invention is not limited by the physical configuration of the substrate 20 as shown herein.

A thermal energy beam 40 is shown emanating from a source 42 and passing through the airtight transmission window 34 to impinge on the first surface 21 of the substrate 20. In one example, the thermal energy beam 40 is a beam of charged particles such as a beam of electrons or a beam of ions. In another example, the thermal energy beam 40 is a beam of electromagnetic radiation such as a laser beam. Examples of a suitable source of the laser beam include a Nd:YAG laser, a frequency double $2\overline{\omega}$ Nd:YAG laser or an Excimer laser.

The thermal energy beam 40 is scanned in two dimensions across the first surface 21 of the substrate 20 to form the wide bandgap material 10. In this example, the wide bandgap material 10 is shown partially formed within the first surface 21 of the substrate 20 after a partial scan of the thermal energy beam 40 across the first surface 21 of the substrate 20.

The first surface 11 of the wide bandgap material 10 is coincident with the first surface 21 of the wideband gap semiconductor substrate 20 with the remainder of the wide bandgap material 10 including the second surface 12 and the peripheral surface 13 being embedded between first and second surfaces 21 and 22 of the substrate 20. It should be emphasized that all material interfaces are not discrete but are continuous or diffuse. Lines are used in the figures to show regions only as a convenience.

The substrate 20 may be formed as a monolith or a thin film substrate having suitable properties for forming the wide bandgap material 10. The non-wide bandgap material 15 has a bandgap equal to or less than two electron volts (2 eV). The wide bandgap bandgap material 10 has a bandgap greater than two electron volts (2 eV).

Preferably, the non-wide bandgap material 15 is sensitive to a thermal conversion process for transforming a layer of the non-wide bandgap material 15 into the wide bandgap material 10. In one example, the non-wide bandgap material 15 is selected from the group consisting of a silicon material (Si), a gallium arsenide material (GaAs), an alumina material ($Al_2O_3$), a silica material ($SiO_2$). Preferably, the non-wide bandgap material 15 is capable of being transformed from a non-wide bandgap material 15 into the wide bandgap material 10 and is capable of being subsequently transformed into an electrical component or device upon further irradiating by the thermal energy beam 40.

Table 1 contrasts various properties of two popular non-wide bandgap semiconductor materials namely silicon (Si) and gallium arsenide (GaAs) with wide bandgap semiconductors namely silicon carbide (SiC) and diamond.

TABLE 1

| Property | Silicon | Gallium Arsenide | 6 H Silicon Carbide | Diamond |
| --- | --- | --- | --- | --- |
| Band Gap | 1.12 eV | 1.424 eV | 3 eV | 5.45 eV |
| Breakdown field | 0.3 MV/cm | 0.4 MV/cm | 3 MV/cm | 10 MV/cm |
| Dielectric constant | 11.7 | 12.9 | 10 | 5.5 |
| Thermal Conductivity | 130 W/K-cm | 55 W/K-cm | 500 W/K-cm | 2200 W/K-cm |
| Saturated electron drift velocity | $1 \times 10^7$ cm/sec | $1 \times 10^7$ cm/sec | $2 \times 10^7$ cm/sec | $2.7 \times 10^7$ cm/sec |

Table 1 illustrates the advantageous properties of wide bandgap materials 10. Unfortunately, wide bandgap materials 10 are currently expensive due to high processing costs and poor yields emanating from wafer growth through device packaging. The present invention transforms a layer of the non-wide bandgap material 15 into a wide bandgap material 10 to provide the advantages of the properties of the wide bandgap material 10 with the cost advantages of the non-wide bandgap material 15.

The present invention may utilize a conventional semiconductor material such as silicon (Si) or gallium arsenide (GaAs) as the non-wide bandgap material 15. In the alternative, the present invention may utilize a low cost ceramic material such as alumina ($Al_2O_3$) or a low cost glass material such as silica ($SiO_2$).

Figure 3:
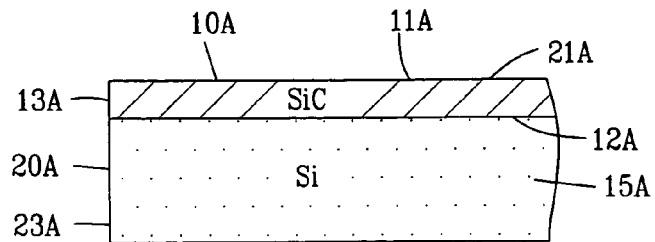
FIG. 3 is an enlarged partial sectional view of a first embodiment of silicon carbide (SiC) wide bandgap material formed in a silicon (Si) non-wide bandgap material.

FIG. 3 is an enlarged sectional view of a first embodiment of the invention illustrating a wide bandgap material 10A formed in the substrate 20A. In this example, the non-wide bandgap material 15A of the substrate 20A is a silicon (Si) material whereas the wide bandgap material 10A is silicon carbide (SiC).

The silicon (Si) non-wide bandgap material 15A is converted into the silicon carbide (SiC) wide bandgap material 10A as the thermal energy beam 40 scans across the first surface 21A of the substrate 20A. The thermal energy beam 40 scans across the first surface 21A of the substrate 20A in an atmosphere of methane gas or acetylene gas. The thermal energy beam 40 heats the silicon atoms of the non-wide bandgap material 15A. The heated silicon atoms of the non-wide bandgap material 15A react with the carbon atoms of the methane gas or acetylene gas atmosphere to create the silicon carbide (SiC) wide bandgap material 10A.

Figure 4:
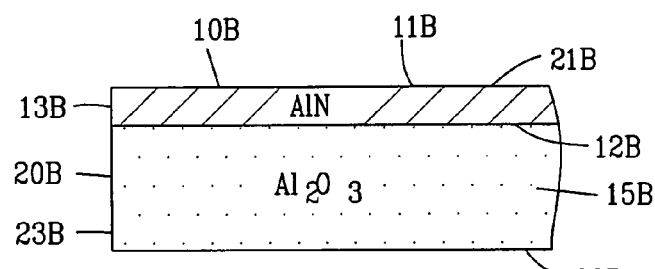
FIG. 4 is an enlarged partial sectional view of a second embodiment of an aluminum nitride (AlN) wide bandgap material formed in an alumina ($Al_2O_3$) non-wide bandgap material.

FIG. 4 is an enlarged sectional view of a second embodiment of the invention illustrating a wide bandgap material 10B formed in the substrate 20B. In this example, the non-wide bandgap material 15B of the substrate 20B is aluminum oxide ($Al_2O_3$) material whereas the wide bandgap material 10B is aluminum nitride (AlN).

The aluminum oxide ($Al_2O_3$) non-wide bandgap material 15B is converted into the aluminum nitride (AlN) wide bandgap material 10B as the thermal energy beam 40 scans across the first surface 21B of the substrate 20B. The thermal energy beam 40 scans across the first surface 21B of the substrate 20B in an atmosphere of nitrogen to create the aluminum nitride (AlN).

Gallium arsenide (GaAs) non-wide bandgap material (thermal conductivity 55 W/m-K) is converted to gallium nitride (GaN) wide bandgap material (thermal conductivity 130 W/m-K) by this method shown for converting aluminum oxide to aluminum nitride.

Typically, the formation of aluminum nitride (AlN) is not chemical and thermodynamically feasible because of the preferred affinity of aluminum for oxygen. A reacting getter such as source of heated carbon is used to remove the oxygen from reacting with the aluminum since oxygen has preferred reactions with carbon. The carbon can be a solid source or a gaseous source such as methane or acetylene. With the gaseous carbon sources the thermal energy beam 40 would be conducted under a mixed atmosphere of methane and nitrogen in simultaneous or subsequent steps.

The thermal carbon process described above or a similar process is used only when the chemistry of the existing substrate is more stable than that of the desired or new substrate surface composition. Once the oxygen is removed, the surface 21B of the substrate 20B can be scanned with the thermal energy beam 40 in the presence of a doping nitrogen gas to create aluminum nitride (AlN). Subsequently, the aluminum nitride (AlN) wide bandgap material 10B may be converted to semiconductors and conductors, or other device in accordance with the teaching of my previously mentioned U.S. Patents.

Figure 5:
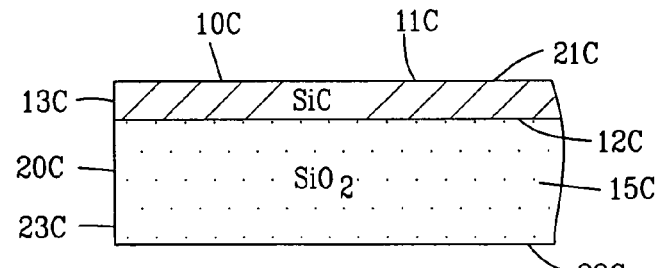
FIG. 5 is an enlarged partial sectional view of a third embodiment of a silicon carbide (SiC) wide bandgap material formed in a silica ($SiO_2$) non-wide bandgap material.

FIG. 5 is an enlarged sectional view of a third embodiment of the invention illustrating a wide bandgap material 10C formed in the substrate 20C. In this example, the non-wide bandgap material 15C of the substrate 20C is a silica ($SiO_2$) material whereas the wide bandgap material 10C is silicon carbide (SiC).

The silica ($SiO_2$) non-wide bandgap material 15C is converted into the silicon carbide (SiC) wide bandgap material 10C as the thermal energy beam 40 scans across the first surface 21C of the substrate 20C. The thermal energy beam 40 scans across the first surface 21C of the substrate 20C in an atmosphere of methane gas or acetylene gas. The thermal energy beam 40 heats the silicon atoms of the non-wide bandgap material 15C. The heated silicon atoms of the non-wide bandgap material 15C react with the carbon atoms of the methane gas or acetylene gas atmosphere to create the silicon carbide (SiC) wide bandgap material 10C.

Figure 6:
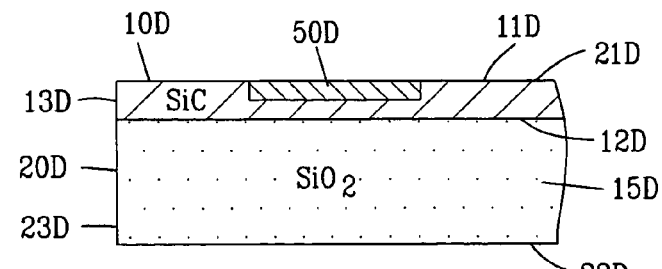
FIG. 6 is an enlarged partial sectional view of a fourth embodiment of a diamond like carbon material formed in the silicon carbide (SiC) wide bandgap material defined in a silica ($SiO_2$) non-wide bandgap material.

FIG. 6 is an enlarged sectional view of a fourth embodiment of the invention illustrating a component 50D defined in a wide bandgap material 10D formed in the substrate 20D. In this example, the component 50 D is a diamond like carbon material (DLC) formed in the silicon carbide (SiC) wide bandgap material 10D defined in a silica ($SiO_2$) non-wide bandgap material 15D. The silica ($SiO_2$) non-wide bandgap material 15D is converted into the silicon carbide (SiC) wide bandgap material 10D as the thermal energy beam 40 scans across the first surface 21D of the substrate 20D as set forth with reference to FIG. 3.

After the silica ($SiO_2$) non-wide bandgap material 15D is converted into the silicon carbide (SiC) wide bandgap material 10D, the silicon carbide (SiC) is converted into the diamond like carbon material (DLC) by selectively removing silicon atoms to create vacancies. The vacancies are then filled with carbon creating the diamond like carbon material (DLC). The thermal energy beam 40 irradiation of the SiC region in a $CO/CO_2$ containing atmosphere diffuses silicon to the surface where the silicon reacts with $CO_2$ to form SiO gas. An increased number of vacancies are left behind in the lattice.

An excimer laser (50 mJ/pulse, 10 Hz pulse repetition rate, 60 pulses, 193 nm wavelength, 20 ns pulse time, CO (partial pressure)/$CO_2$ (partial pressure)=$5 \times 10^4$) creates the temperature range 2000-2300° C. necessary to energize silicon ($SiO_2$) self diffusion in silicon carbide (SiC). Carbon is then diffused into the substrate to fill the vacancies by laser irradiation, for example by (Nd:YAG, excimer etc.) in a methane or acetylene atmosphere to dissociate the hydrocarbon and drive (diffuse) atomic carbon into the silicon carbide (SiC) and if necessary orient or recrystallize the crystal structure.

Figure 7:
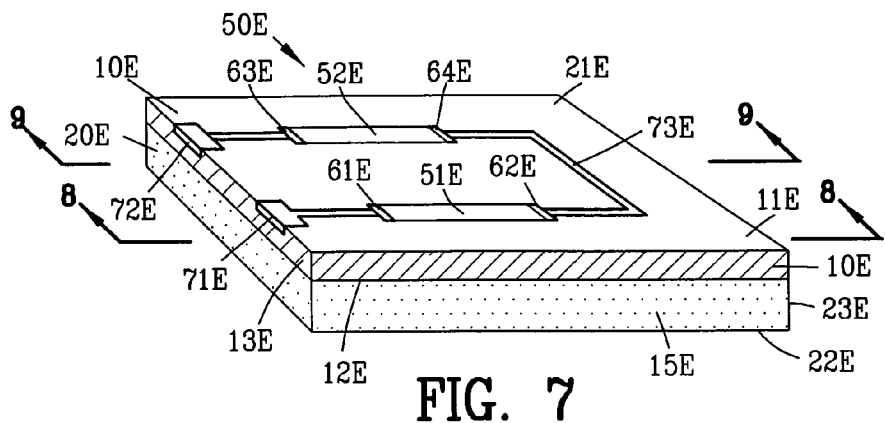
FIG. 7 is an enlarged isometric view of a fifth embodiment of an improved component formed in the wide bandgap material.

FIG. 7 is an enlarged isometric view of a fifth embodiment of the invention illustrating a semiconductor device 50E defined in the wide bandgap material 10E formed in the substrate 20E. The semiconductor device 50E may be one or more of a variety of devices such as an active or passive electrical device, a photonic device, an optical device, a sensor device, a spintronic device or any other suitable semiconductor device. In this example, the semiconductor device 50E is shown as a first semiconductor device 51E and a second semiconductor device 52E.

Figure 8:
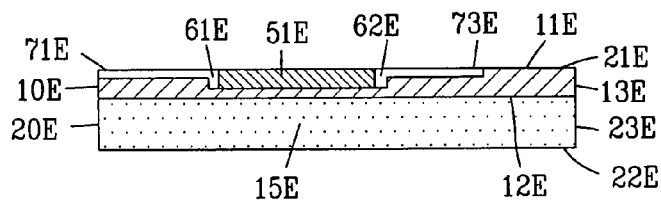
FIG. 8 is a sectional view along line 8-8 in FIG. 7.

FIG. 8 is a sectional view along line 8-8 in FIG. 7 illustrating the first semiconductor device 51E of FIG. 7. The first semiconductor device 51E is defined in the wide bandgap material 10E. The first semiconductor device 51E is connected by an electrode 61E to a first conductor 71E. An electrode 62E connects the first semiconductor device 51E to a connector 73E.

Figure 9:
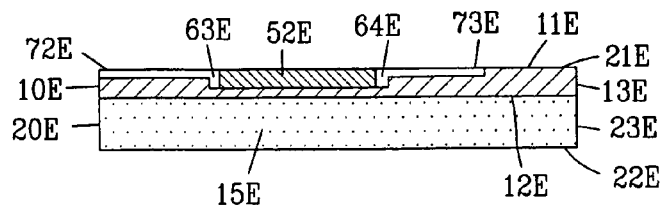
FIG. 9 is a sectional view along line 9-9 in FIG. 7.

FIG. 9 is a sectional view along line 9-9 in FIG. 7 illustrating the second semiconductor device 52E of FIG. 7. The second semiconductor device 52E is defined in the wide bandgap material 10E. The second semiconductor device 52E is connected by an electrode 63E to a second conductor 72E. An electrode 64E connects the second semiconductor device 52E to the connector 73E.

Preferably, the first and/or second semiconductor device 51E and 52E are formed in the wide bandgap material 10E by scanning the thermal energy beam 40 across selected portions of the wide bandgap material 10E in the presence of a doping atmosphere to form the first and/or second semiconductor device 51E and 52E. In the alternative, the first and/or second semiconductor device 51E and 52E may be formed in a conventional manner as should be well known in the art.

Figure 10:
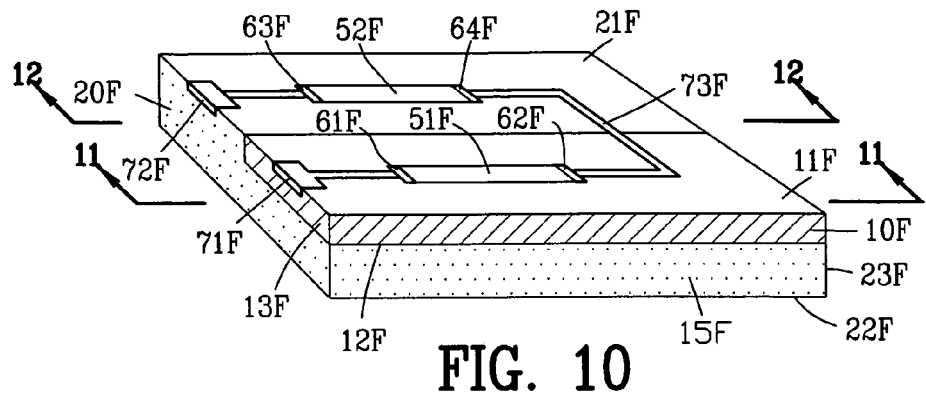
FIG. 10 is an enlarged isometric view of a sixth embodiment of an improved semiconductor device formed in the wide bandgap material.

FIG. 10 is an enlarged isometric view of a sixth embodiment of the invention illustrating a first semiconductor device 51F defined in the wide bandgap material 10F and a second semiconductor device 52F defined in the non-wide bandgap material 15F.

Figure 11:
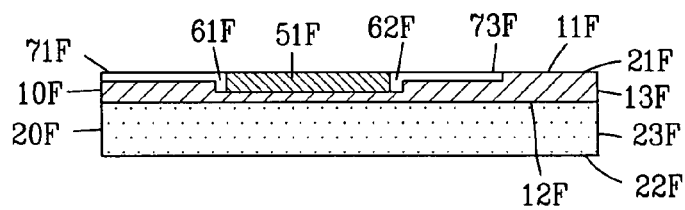
FIG. 11 is a sectional view along line 11-11 in FIG. 10.

FIG. 11 is a sectional view along line 11-11 in FIG. 10 illustrating the first semiconductor device 51F of FIG. 10. The first semiconductor device 51F is defined in the wide bandgap material 10F. The first semiconductor device 51F is connected by an electrode 61F to a first conductor 71F. An electrode 62F connects the first semiconductor device 51F to a connector 73F. The first semiconductor device 51F may be one or more of a variety of devices such as an active or passive electrical device, a photonic device, an optical device, a sensor device, a spintronic device or any other suitable semiconductor device.

Preferably, the first semiconductor device 51F is formed in the wide bandgap material 10F by scanning the thermal energy beam 40 across selected portions of the wide bandgap material 10F in the presence of a doping atmosphere to form the first semiconductor device 51F. In the alternative, the first semiconductor device 51F may be formed in a conventional manner as should be well known in the art.

Figure 12:
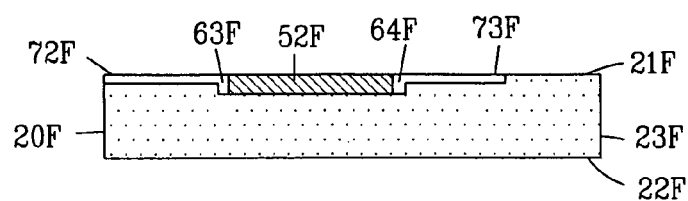
FIG. 12 is a sectional view along line 12-12 in FIG. 10.

FIG. 12 is a sectional view along line 12-12 in FIG. 10 illustrating the second semiconductor device 52F of FIG. 10. The second semiconductor device 52F is defined in the non-wide bandgap material 15F. The second semiconductor device 52F is connected by an electrode 63F to a second conductor 72F. An electrode 64F connects the second semiconductor device 52F to the connector 73F.

Preferably, the second semiconductor device 52F is formed in the non-wide bandgap material 15F in a conventional manner as should be well known in the art. In the alternative, the second semiconductor device 52E may be formed by scanning the thermal energy beam 40 across selected portions of the non-wide bandgap material 15F in the presence of a doping atmosphere to form the second semiconductor device 52F.

The thermal energy beam 40 conversion and doping technology can be applied to the fabrication of conductors, different semiconductor and insulator phases in silicon carbide (SiC). Conductors can be fabricated by doping titanium into silicon carbide (SiC) by laser scanning in a titanium tetra chloride, or other titanium metallo-organic gas atmosphere. Different semiconductor phases can be created by scanning a material with the thermal energy beam 40 in an atmosphere of nitrogen (n-type), phosphine (n-type) or di-borane (p-type), trimethylaluminum (p-type) etc. Insulators can be created by scanning a material with the thermal energy beam 40 in an atmosphere of oxygen.

Figure 13:
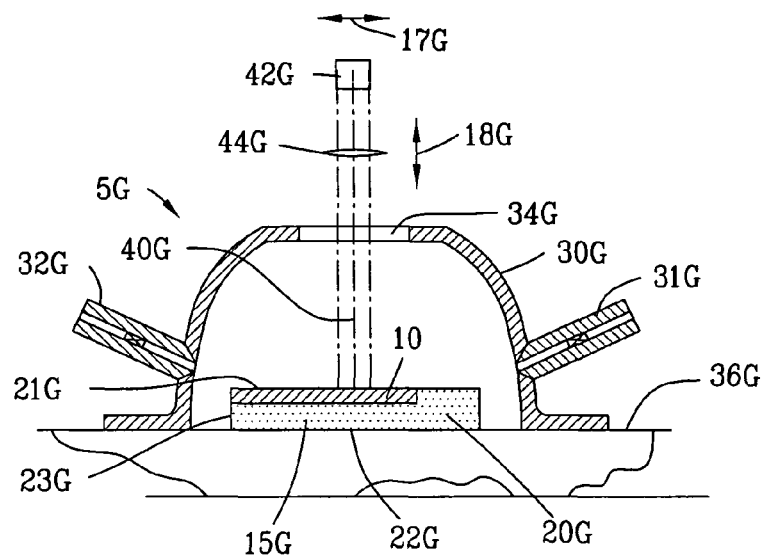
FIG. 13 is a side view of an apparatus similar to FIG. 1 for forming further embodiments of the invention.

FIG. 13 is a side view of an apparatus similar to FIG. 1 for increasing the thermal conductivity in a substrate 20G formed from a non-wide bandgap material 15G. The substrate 20G is located in an air-tight chamber 30G. The chamber 30G has an inlet and valve combination 31G and outlet and valve combination 32G connected to the side wall of the chamber 30G for injecting and removing gases such as doping and/or reacting gasses. An airtight transmission window 34G is located within the chamber 30G. The chamber 30G is disposed on a support member 36G forming an airtight seal therewith.

A thermal energy beam 40G is shown emanating from a source 42G and passing through the airtight transmission window 34G to impinge on the first surface 21G of the substrate 20G. The thermal energy beam 40G may comprise a beam of charged particles such as a beam of electrons or a beam of ions or a beam of electromagnetic radiation such as a laser beam. Examples of a suitable source of the laser beam include a Nd:YAG laser, a frequency double $2\overline{\omega}$ Nd:YAG laser or an Excimer laser.

Figure 14:
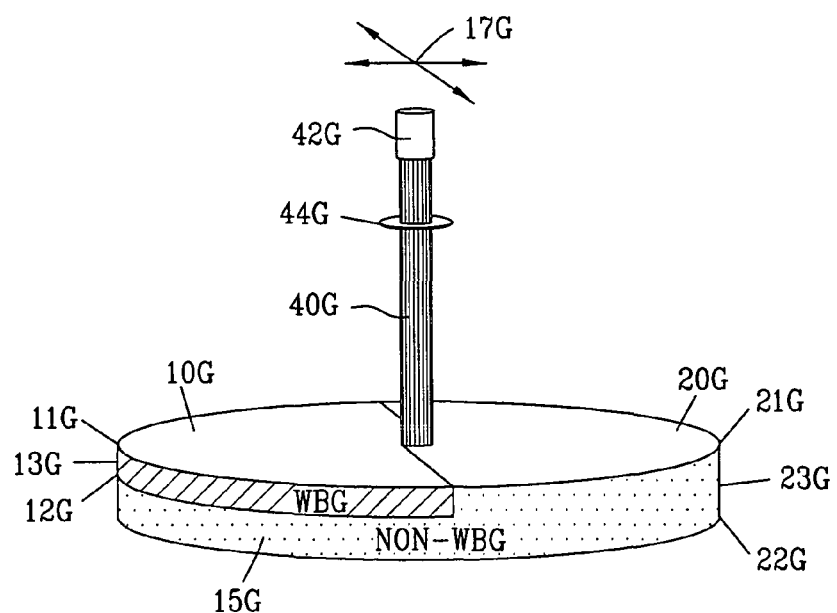
FIG. 14 is a first step in the process of increasing the thermal conductivity in a non-wide bandgap substrate illustrating the scanning of a first thermal energy beam across the substrate in the presence of a doping gas to create a layer of wide bandgap material.

FIG. 14 is an enlarged isometric view of the substrate 20G of the non-wide bandgap material 15G shown in FIG. 13. The non-wide bandgap material 15G is indicated as NON-WBG. The substrate 20G defines a first and a second surface 21G and 22G and a peripheral edge 23G. In this example, a first region of the substrate 20G is located in proximity to the first surface 21G of the substrate 20G whereas a second region of the substrate 20G is located in proximity to the second surface 22G of the substrate 20G.

The substrate 20G may be formed as a monolith or a thin film substrate 20 having suitable properties for forming the wide bandgap material 10G. The non-wide bandgap material 15G has a bandgap equal to or less than two electron volts (2 eV).

The non-wide bandgap material 15G is sensitive to a thermal conversion process. Preferably, the non-wide bandgap material 15G can be transformed from the non-wide bandgap material 15G into the wide bandgap material 10G. Furthermore, the transformed wide bandgap material 10G can be transformed further into a thermal conducting material 50G upon further irradiating by a thermal energy beam 40G. In one example, the non-wide bandgap material 15G is selected from the group consisting of a silicon material (Si), a gallium arsenide material (GaAs), an alumina material ($Al_2O_3$), a silica material ($SiO_2$).

FIG. 14 illustrates a first step in the process of increasing the thermal conductivity in the non-wide bandgap substrate 20G. A doping gas is applied to the first surface 21G of the non-wide bandgap substrate 20G within the air-tight chamber 30G. In one example, the doping gas is selected from the group consisting of methane, acetylene and nitrogen.

The thermal energy beam 40G is scanned in two dimensions as indicated by the arrows 17G across the first surface 21G of the substrate 20G in the presence of the doping gas to form the wide bandgap material 10G within the first region of the substrate 20G. In this example, the wide bandgap material 10G is shown partially formed within the first region of the substrate 20G adjacent to the first surface 21G of the substrate 20G. The wide bandgap material 10G is indicated as WBG. The thermal energy beam 40G continues to scan in two dimensions as indicated by the arrows 17G until the entire first region of the substrate 200 is converted into the wide bandgap material 10G.

The wide bandgap material 10G defines a first and a second surface 11G and 12G and a peripheral edge 13G. The first surface 11G of the wide bandgap material 10G is coincident with the first surface 21G of the substrate 20G with the remainder of the wide bandgap material 10G being embedded between first and second surfaces 21G and 22G of the substrate 20G. The wide bandgap material 10G has a higher thermal conductivity than the non-wide bandgap substrate 20G. The wide bandgap material 10G embedded within the substrate 20G enhances the thermal conductivity between the first and the second regions of the substrate 20G.

The wide bandgap material 10G has a bandgap greater than two electron volts (2 eV). In one example, the wide bandgap material 10G is selected from the group consisting of silicon carbide, diamond, diamond like carbon, aluminum nitride, boron nitride and gallium nitride.

FIGS. 13-14 illustrate a line interface separating the wide bandgap material 10G and the non-wide bandgap material 15G. However, it should be appreciated that the actual interface between the wide bandgap material 10G and the non-wide bandgap material 15G is a continuous or a diffuse interface.

Figure 15:
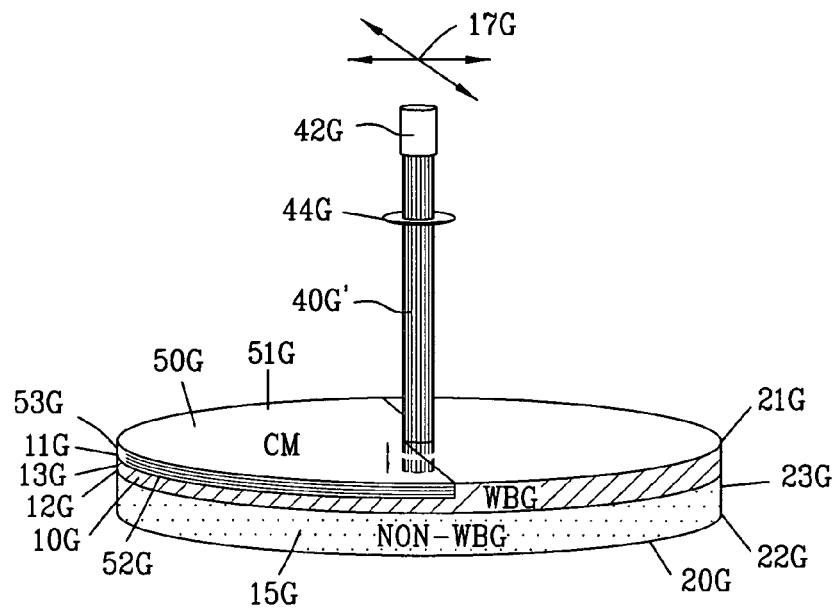
FIG. 15 is a second step in the process of increasing the thermal conductivity in a substrate illustrating the scanning of a second thermal energy beam across the layer of wide bandgap material create a layer of thermal conducting material in the wide bandgap material.

FIG. 15 illustrate the forming of thermal conducting material 50G within the wide bandgap material 10G of the substrate 20G. The thermal conducting material 50G is indicated as CM. A second doping gas is applied to the wide bandgap material 10G. A second thermal energy beam 40G' is scanned across the wide bandgap material 10G of the substrate 20G. The irradiation of the wide bandgap material 10G of the substrate 20O by the second thermal energy beam 40G' in the presence of the second doping gas converts a portion of the wide bandgap material 10G into a layer of thermal conducting material 50G. The second thermal energy beam 40G' continues to scan in two dimensions as indicated by the arrows 17G until the entire first region of the substrate 20G is converted into the thermal conducting material 50G.

The thermal conducting material 50G defines a first and a second surface 51G and 52G and a peripheral edge 53G. The first surface 51G of the thermal conducting material 50O is coincident with the first surface 11G of the wide bandgap material 10G with the remainder of the thermal conducting material 50G being embedded between first and second surfaces 11G and 12G of the wide bandgap material 10G.

The thermal conducting material 50O has a higher thermal conductivity than the wide bandgap material 10O. The thermal conducting material 50O embedded within the wide bandgap material 10G further enhances the thermal conductivity between the first and the second regions of the substrate 20G.

In many examples, the thermal conducting material 50O is formed within the wide bandgap material 10G having molecular planes including basal planes 55G. The second thermal energy beam 40G' forms the basal planes 55G that are disposed parallel to an external surface of the substrate 20G. In this example, the external surface of the substrate 20G is shown as the first surface 21G of the substrate 20G.

Figure 16:
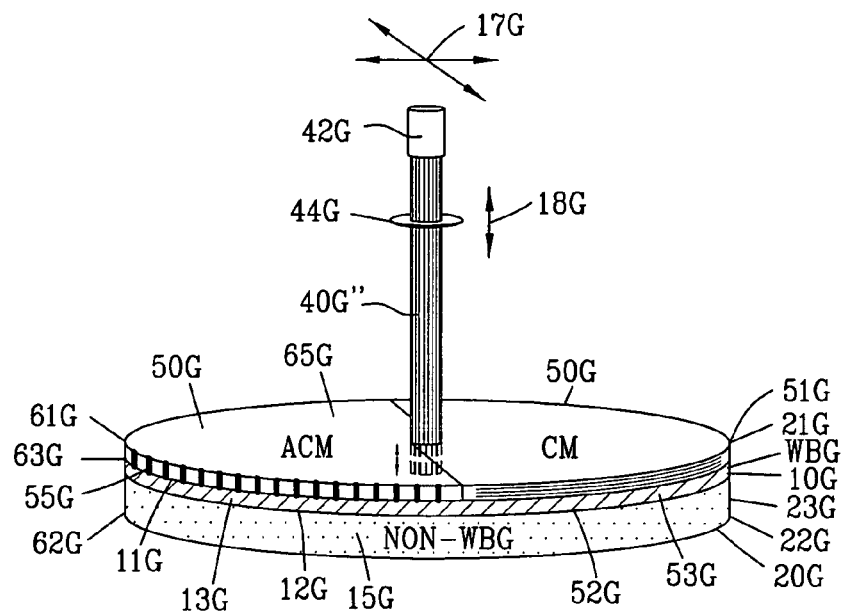
FIG. 16 is a third step in the process of increasing the thermal conductivity in a substrate illustrating the focusing of a third thermal energy beam inside of the thermal conducting material to aligning the molecular planes of the thermal conducting material to extend outwardly from the substrate.

FIG. 16 illustrates the focusing of a third thermal energy beam 40G" inside of the thermal conducting material 50G. The third thermal energy beam 40G" is scanned in two dimensions across the thermal conducting material 50G while simultaneously altering the focal point of the third thermal energy beam 40G" inside of the thermal conducting material 50G. Initially, the focal point of the third thermal energy beam 40G" is positioned inside of the thermal conducting material 50G with the focal point being gradually moved toward the external surface or the first surface 21G of the substrate 20G.

The altering of the focal point of the third thermal energy beam 40G" inside of the thermal conducting material 50G orientates the basal planes 55G of the thermal conducting material 50G to extend from the substrate 20G. In this example, the altering of the focal point of the third thermal energy beam 40G" inside of the thermal conducting material 50G aligns the basal planes 55G to be generally perpendicular to the external surface or the first surface 21G of the substrate 20G. The alignment of the basal planes 55G of the thermal conducting material 50G to extend from the external surface of the substrate 20G further enhances the thermal conductivity between the first and the second regions of the substrate 20G. The thermal conducting material 50G having aligned basal planes 55G is indicated as ACM.

Figure 17:
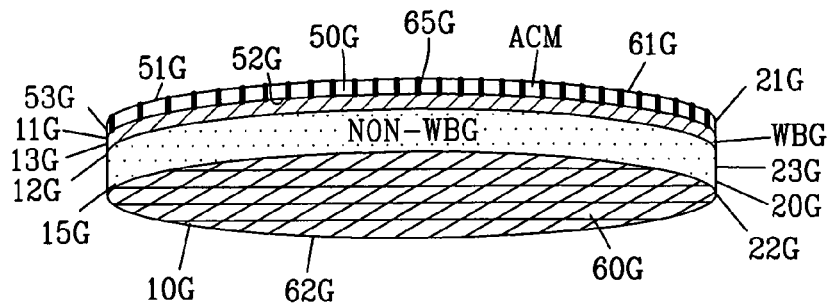
FIG. 17 illustrates the cutting is a substrate into a plurality of dies.

FIG. 17 illustrates the substrate 20G severed into a plurality of dies 60G. Each of the plurality of dies 60G defines a first region 61G and a second region 62G. The first region 61G comprises the thermal conducting material 50G whereas the second region 62G comprises the non-wide bandgap material 15G.

Figure 18:
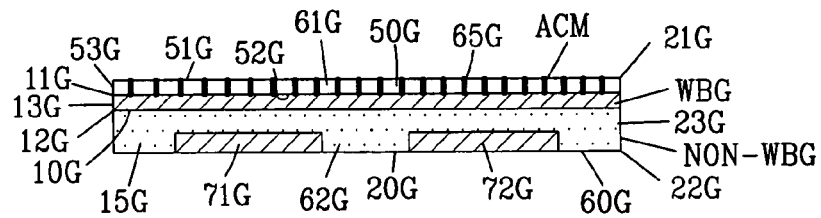
FIG. 18 is a side sectional view of one of the plurality of dies of FIG. 17 incorporating electronic components with the increasing the thermal conductivity in a substrate cooling the electronic components.

FIG. 18 is a side sectional view of one of the plurality of dies 60G of FIG. 17. The basal planes 55G of the thermal conducting material 50G act as a plurality of micro fins 65G extending in a parallel relationship to be orientated generally perpendicular to the external surface shown as the first surface 21G of the substrate 20G. The plurality of micro fins 65G effectively increase the surface area of first region 61G for increasing the transfer of heat between the first region 61G of the die 60G and an ambient such as ambient air or ambient vacuum. The plurality of micro fins 65G creates an integral heat exchanger with the substrate 20G.

The die 60G may be further fabricated into various types of devices such as sensors, detectors, electrical components, integrated circuits and the like. In this example, plural electronic components 71G and 72G are formed within the non-wide bandgap material 15G. Preferably, the plural electronic components 71G and 72G are formed in the non-wide bandgap material 15G in a conventional manner as should be well known in the art. In the alternative, the plural electronic components 71G and 72G may be formed by scanning the thermal energy beam 40 across selected portions of the non-wide bandgap material 15G in the presence of a doping atmosphere to form the plural electronic components 71G and 72G.

It is evident that increased thermal conductivity of the dies 60G may transfer heat from the plural electronic components 71G and 72G on the second region 62G to the first region 61G to cool the plural electronic components 71G and 72G. However, it should be appreciated by those skilled in the art that increased thermal conductivity of the die 60G can transfer heat from the first region 61G to heat the plural electronic components 71G and 72G on the second region 62G.

Figure 19:
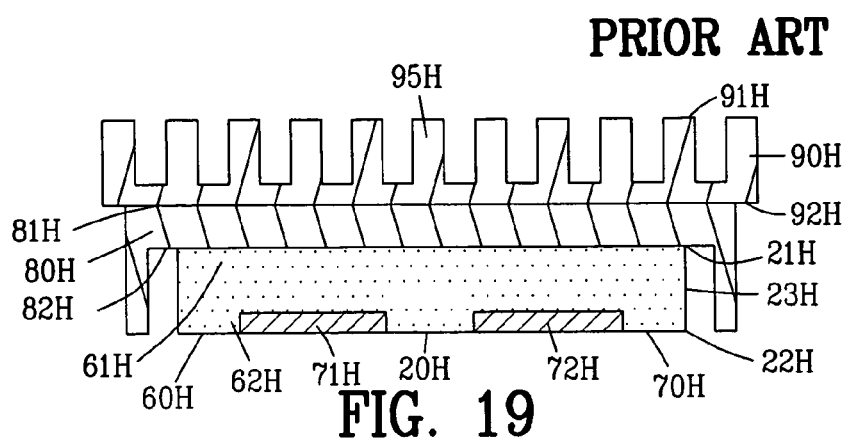
FIG. 19 is a side sectional view of a convention die of the prior art incorporated into a conventional heat spreader and a conventional heat sink of the prior art.

FIG. 19 is a side sectional view of a convention die 60H of the prior art incorporated into a conventional heat spreader 80H and a conventional heat sink 90H of the prior art. The die 60H defines a first region 61H and a second region 62H. Plural electronic components 71H and 72H are located on the second region 62H of the die 60H.

The conventional heat spreader 80H defines a first surface 81H and a second surface 82H whereas the conventional heat sink 90H defines a first surface 91H and a second surface 92H. The first surface 91H of the conventional heat sink 90 defines a plurality of fins 95H.

Heat generated by the plural electronic components 71H and 72H is transferred from the second region 62H to the first region 61H of the die 60H. Heat from the first region 61H of the die 60H is transferred through the heat spreader 80H to the heat sink 90H. The thermal conductivity between the first region 61H of the die 60H and the plurality of fins 95H is substantially reduced by the interfaces located at the first and second surfaces 81H and 82H of the conventional heat spreader 80H.

The die 60G of the present invention incorporates several advantages over the die 60H of the prior art. Firstly, the substrate 20G has a higher thermal conductivity due to the presence of the wide bandgap material 10G and/or the presence of the thermal conducting material 50G. Secondly, the interfaces between the non-wide bandgap material 15G, the wide bandgap material 10G and/or the thermal conducting material 50G do not impede the thermal conductivity between the first region and second regions 61G and 62G of the die 60G. Thirdly, the die 60G of the present invention is an integral unit in contrast to the assembly of the die 60H of the prior art. Finally, the die 60G of the present invention is smaller than the assembly of the die 60H of the prior art.

FIGS. 20-23 illustrate a process for increasing the thermal conductivity of a substrate 20I formed from a silicon material 15I. The process for increasing the thermal conductivity shown in FIGS. 20-23 may or may not be a part of the prior art.

Figure 20:
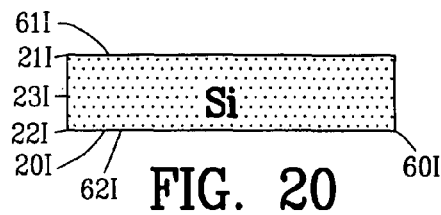
FIG. 20 is a side sectional view of a silicon substrate.

FIG. 20 is a side sectional view of a silicon substrate 20I formed from a silicon material 15I. The substrate 20I defines a first and a second surface 21I and 22I and a peripheral edge 23I. In this example, a first region 61I of the substrate 20I is located in proximity to the first surface 21I of the substrate 20I whereas a second region 62I of the substrate 20I is located in proximity to the second surface 22I of the substrate 20I.

Figure 21:
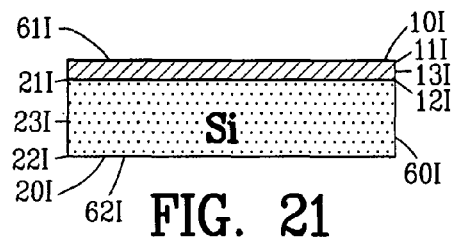
FIG. 21 is a side sectional view of the silicon substrate of FIG. 20 with a layer of silicon carbide material deposited onto the silicon substrate by a conventional vapor deposition process.

FIG. 21 is a side sectional view of the silicon substrate 20I of FIG. 20 with a layer of silicon carbide material 10I deposited onto the first side 21I of the silicon substrate 20I by a conventional vapor deposition process. The process of depositing a silicon carbide material 10I onto a substrate 20I by a conventional vapor should be well known to those skilled in the art.

Figure 22:
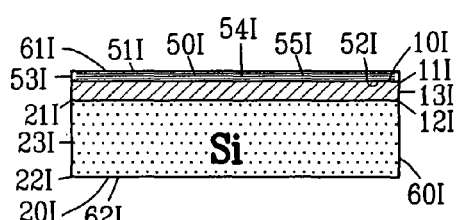
FIG. 22 is a side sectional view of the substrate of FIG. 21 with a layer of carbon thermal conducting material deposited onto the silicon carbide material by a conventional vapor deposition process.

FIG. 22 is a side sectional view of the substrate 20I of FIG. 21 with a layer of thermal conducting material 50I deposited onto the silicon carbide material 50I by a conventional vapor deposition process. The thermal conducting material 50I is shown as a carbon material 54I.

Figure 23:
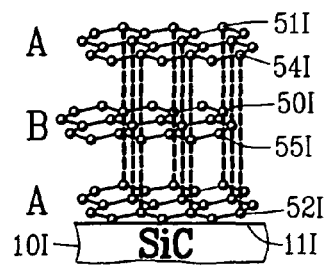
FIG. 23 is a magnified view of a portion of FIG. 22 illustrating the alignment of the molecular planes of the carbon thermal conducting material.

FIG. 23 is a magnified view of a portion of FIG. 22 illustrating the alignment of the molecular basal planes 55I of the carbon material 54I. The basal planes 55I of the carbon material 54I are shown as planes A-B-A. The planes A-B-A of the basal planes 55I are formed to be generally parallel to the first side 21I of the silicon substrate 20I by the conventional vapor deposition process.

FIGS. 20-23 illustrate a process for increasing the thermal conductivity of a substrate 20I formed from a silicon material 15I. The process for increasing the thermal conductivity shown in FIGS. 20-23 increases the thickness of the assembly as the layers of silicon carbide material 10I and the thermal conducting material 50I are added onto the silicon substrate 20I. Furthermore, the conventional vapor deposition processes creates an interface between the silicon substrate 20I and the silicon carbide material 10I as well as creating an interface between the silicon carbide material 10I and the thermal conducting material 50I.

FIGS. 24-29 illustrate a process of the present invention for increasing the thermal conductivity of a substrate 20J formed from a silicon material 15J. As will be described in greater detail hereinafter, the process utilizes the thermal energy beams in a manner similar to the process shown in FIGS. 13-16.

Figure 24:
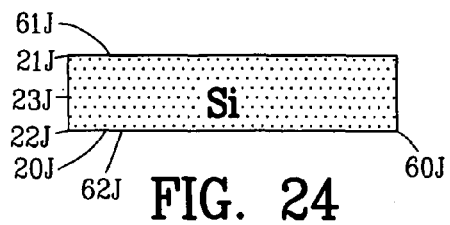
FIG. 24 is a side sectional view of a silicon substrate.

FIG. 24 is a side sectional view of a silicon substrate 20J formed from a silicon material 15J. The substrate 20J defines a first and a second surface 21J and 22J and a peripheral edge 23J. In this example, a first region 61J of the substrate 20J is located in proximity to the first surface 21J of the substrate 20J whereas a second region 62J of the substrate 20J is located in proximity to the second surface 22J of the substrate 20J.

Figure 25:
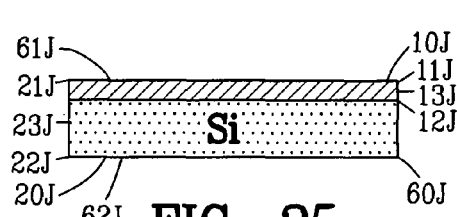
FIG. 25 is a side sectional view of the silicon substrate of FIG. 24 with a layer of the silicon material being converted into silicon carbide material by a thermal energy beam in the presence of a doping gas.

FIG. 25 is a side sectional view of the silicon substrate 20J of FIG. 24 with a portion of the first region 61J being converted into a layer of silicon carbide material 10J. A first thermal energy beam (not shown) is scanned in two dimensions across the first region 61J in the presence of a carbon donating doping gas to form the wide bandgap material 10J within the first region of the substrate 20J. The first carbon donating doping gas may be selected from the group consisting of methane and acetylene. The silicon carbide material 10J formed in the substrate 20J can be up to 600 nanometers or greater depending upon the intended geometry and cooling requirements as well as the intended application and use of the silicon substrate 20J.

Table 2 lists various parameters for converting a portion of the silicon substrate 20J into a layer of silicon carbide material 10J.

TABLE 2

| Laser Type | KrF Excimer | ArF Excimer |
|---|---|---|
| Wavelength (nm) | 248 | 193 |
| Laser Fluence (J/cm$^2$) | 1.5 | 1.0 |
| Pulse Repetition Rate (kHz) | 1.0 | 1.0 |
| Number of Pulses | 600 | 600 |
| Beam Area (2 mm × 2.5 mm) | 5.0 | 5.0 |
| Scanning Plane (mm/s) | X – Y (surface) | |
| Atmosphere | Methane | |

Figure 26:
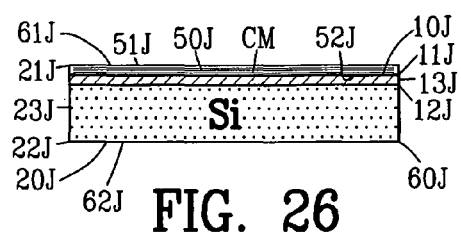
FIG. 26 is a side sectional view of the substrate of FIG. 25 with a layer of the silicon carbide material being converted into a carbon thermal conducting material by a thermal energy beam in the presence of a reacting gas.

FIG. 26 is a side sectional view of the substrate 20J of FIG. 25 with a portion of the silicon carbide material 10J being converted into a layer of thermal conducting carbon material 50J. A second thermal energy beam (not shown) is scanned in two dimensions across the wide bandgap material 10J in the presence of second reacting gas.

The second thermal energy beam (not shown) in combination with the second reacting gas diffuses silicon of the silicon carbide material 10J to the first surface 11J thereby creating a layer of silicon carbide material 10J having lattice vacancies. The second reacting gas may be selected from the group consisting of carbon monoxide and carbon dioxide. The carbon monoxide and/or carbon dioxide react with the diffused silicon to form a silicon oxide gas and prevent oxidation of the substrate surface.

Table 3 lists various parameters for creating a layer of silicon carbide material 10J having lattice vacancies.

TABLE 3

| Laser Type | Excimer |
|---|---|
| Wavelength (nm) | 193 |
| Energy Pulse (mJ/pulse) | 260 |
| Pulse Repetition Rate (Hz) | 10 |
| Number of Pulses | 60 |
| Pulse Time (nsec) | 20 |
| Beam Area (2 mm × 2.5 mm) | 5.0 |
| Scanning Plane (mm/s) | X – Y (surface) |
| Atmosphere | CO partial pressure = 5 × 10$^4$ CO2 partial pressure |

A third thermal energy beam (not shown) is directed onto the layer of silicon carbide material 10J having lattice vacancies in the presence of a third carbon donating doping gas to diffuse carbon into the lattice vacancies to create a carbon rich layer having an atomic structure defining basal planes 55J. The third carbon donating doping gas may be selected from the group consisting of methane and acetylene.

Table 4 lists various parameters for diffusing carbon into the lattice vacancies to create a carbon rich layer having an atomic structure defining basal planes 55J.

TABLE 4

| Laser Type | KrF Excimer | ArF Excimer |
|---|---|---|
| Wavelength (nm) | 248 | 193 |
| Laser Fluence (J/cm$^2$) | 1.5 | 1.0 |
| Pulse Repetition Rate (kHz) | 1.0 | 1.0 |
| Number of Pulses | 600 | 600 |
| Beam Area (2 mm × 2.5 mm) | 5.0 | 5.0 |
| Scanning Plane (mm/s) | X – Y (surface) | |
| Atmosphere | Methane | |

Figure 27:
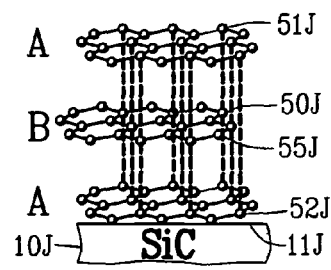
FIG. 27 is a magnified view of a portion of FIG. 26 illustrating the alignment of the molecular planes of the carbon thermal conducting material.

FIG. 27 is a magnified view of a portion of FIG. 26 illustrating the alignment of the crystal lattice basal planes 55J of the carbon material 54J. The basal planes 55J of the carbon material 54J are shown as planes A-B-A. The planes A-B-A of the basal planes 55J are formed to be generally parallel to the first side 21J of the silicon substrate 20J.

FIG. 28 is a side sectional view of the silicon substrate 20J of FIG. 27 with the crystal lattice basal planes 55J of the carbon material 54J being orientated generally perpendicular to the first surface 21J of the substrate 20J. A fourth thermal energy beam (not shown) is focused inside the carbon material 54J for aligning the basal planes 55J of the carbon material 54J to be generally perpendicular to an external surface of the substrate to enhance the thermal conductivity between the first and the second regions of the substrate for cooling the silicon substrate.

The fourth thermal energy beam (not shown) is scanned in two dimensions across the carbon material 54J while simultaneously altering the focal point inside of the carbon material 54J. The focal point of the fourth thermal energy beam (not shown) is positioned inside of the carbon material 54J with the focal point being gradually moved toward the first surface 21J of the substrate 20J. The movement of the focal point of the fourth thermal energy beam (not shown) within the carbon material 54J aligns the basal planes 55J of the carbon material 54J to be generally perpendicular to an external surface shown as the first surface 21J of the substrate 20J.

The three dimensional movement of the fourth thermal energy beam (not shown) within the carbon material 54J results in the melting and/or solid state diffusion of the basal planes 55J formed generally parallel to the first side 21J of the silicon substrate 20J. The three dimensional movement of the fourth thermal energy beam (not shown) further results in the controlled crystallization or recrystallization of the basal planes 55J to be generally perpendicular to the first surface 21J after the melting and/or solid state diffusion. The aligned basal planes 55J oriented generally perpendicular to an external surface shown as the first surface 21J of the substrate 20J can be up to 500 nm or greater depending upon the intended geometry and cooling requirements as well as the intended application and use of the silicon substrate 20J.

Table 5 lists various parameters for aligning the basal planes 55J of the carbon material 54J to be generally perpendicular to an external surface shown as the first surface 21J of the substrate 20J.

TABLE 5

| Laser Type | Nd: YAG |
| --- | --- |
| Wavelength (nm) | 1064 |
| Pulse Width (nsec) | 260 |
| Pulse Repetition Rate (kHz) | 35 |
| Power (W) | 69.3 |
| Beam Diameter (µm) | 1.0 |
| Beam Scan Rate (mm/s) | 5.0 |
| Scanning Plane (mm/s) | Z – Y, Z – X, Z perpendicular to substrate |
| Atmosphere | Air or Argon |

FIG. 29 is a magnified view of a portion of FIG. 28 illustrating the alignment of the molecular basal planes 55J of the carbon material 54J. The basal planes 55J of the carbon material 54J are shown as planes A-B-A. The planes A-B-A of the basal planes 55J are formed to be generally perpendicular to the first side 21J of the silicon substrate 20J. In this specification, the term aligning the basal planes 55J to be generally perpendicular to the external surface to the first side 21J of the silicon substrate 20J should be interpreted as a statistical significant number of molecules of the carbon material 54J being oriented within forty-five degrees of a perpendicular extending from the external surface of the first side 21J of the silicon substrate 20J.

FIGS. 30-32 illustrate a process of the present invention for increasing the thermal conductivity of a substrate 20K formed from a silicon carbide material 10K. The process utilizes thermal energy beams in a manner similar to the process shown in FIGS. 26-28.

FIG. 30 is a side sectional view of a substrate 20K formed from a silicon carbide material 10K. The substrate 20K defines a first and a second surface 21K and 22K and a peripheral edge 23K. A first region 61K of the substrate 20K is located in proximity to the first surface 21K of the substrate 20K whereas a second region 62K of the substrate 20K is located in proximity to the second surface 22K of the substrate 20K.

FIG. 31 is a side sectional view of the substrate 20K of FIG. 30 with a portion of the silicon carbide material 10K being converted into a layer of thermal conducting carbon material 50K. A first thermal energy beam (not shown) is scanned in two dimensions across the wide bandgap material 10K in the presence of a reacting gas.

The first thermal energy beam in combination with the reacting gas diffuses silicon of the silicon carbide to the first surface 21K thereby creating a layer of silicon carbide having lattice vacancies. The silicon carbide at the first surface 21K reacts with the reacting gas to form a silicon oxide gas. The reacting gas may be selected from the group consisting of carbon monoxide and carbon dioxide.

A second thermal energy beam is directed onto the layer of silicon carbide having lattice vacancies in the presence of a carbon donating doping gas to diffuse carbon into the lattice vacancies to create a carbon rich layer having an atomic structure defining basal planes 55K. The basal planes 55K are formed to be generally parallel to the first side 21K of the substrate 20K in a manner similar to the basal planes 55J shown in FIG. 27. The carbon donating doping gas may be selected from the group consisting of methane and acetylene.

FIG. 32 is a side sectional view of the substrate 20K of FIG. 31 with the crystal lattice basal planes 55K of the carbon material 54K being aligned generally perpendicular to the first surface 21K of the substrate 20K. A third thermal energy beam (not shown) is focused inside the carbon material 54K for aligning the basal planes 55K of the carbon material 54K to be generally perpendicular to an external surface of the substrate 20K to enhance the thermal conductivity between the first and the second regions 61K and 62K of the substrate 20K for cooling the substrate 20K.

The fourth thermal energy beam (not shown) is scanned in two dimensions across the carbon material 54K while simultaneously altering the focal point of the inside carbon material 54K. The movement of the focal point of the fourth thermal energy beam (not shown) within the carbon material 54K aligns the basal planes 55K of the carbon material 54K to be generally perpendicular to an external surface in a manner similar to the basal planes 55J shown in FIG. 29.

FIG. 33 is a graph of the thermal conductivity of different carbon materials. The thermal conductivity of diamond or diamond like carbon material is compared to the thermal conductivity of graphite along the basal planes A-B-A and the thermal conductivity of graphite normal to the basal planes A-B-A. The thermal conductivity of graphite along the basal planes A-B-A is significantly greater than the thermal conductivity of graphite normal to the basal planes A-B-A.

The incorporation of the carbon material 54J within the silicon carbide material 10J increases the thermal conductivity of the silicon substrate 20J irrespective of the orientation of the basal planes 55J. A greater thermal conductivity of the silicon substrate 20J is achieved when the basal planes 55J are aligned generally perpendicular to an external surface 21J of the silicon substrate 20J. The greatest thermal conductivity of the silicon substrate 20J is achieved with a diamond or diamond like carbon material. Although the carbon material 54J is shown as a graphite structure in FIGS. 23, 27 and 29, it should be understood that the carbon material 54J can actually have various degrees or types of crystalline structure.

In another example of the invention the silicon substrate is first converted to a silicon carbide region using the process parameters given in Table 2. The silicon carbide is then simultaneously converted into a carbon rich region (75-100 atomic % carbon) using the process parameters given in Table 5 where scanning is in the x-y plane. Various allotropes of carbon rich regions can be classified into different groups based on the dimension of their crystal structures, such as zero-dimensional carbon (buckyballs), one-dimensional carbon (nanotubes), two-dimensional carbon (graphene) and three-dimensional carbon (diamond and graphite).

In another example of the invention the silicon substrate is first converted to a silicon carbide region using the process parameters given in Table 2. The silicon carbide is then simultaneously converted into a carbon rich graphite-like region (75-100 atomic % carbon) that has basal planes generally oriented generally perpendicular to the substrate surface using the process parameters given in Table 5 where scanning is in the z-x and z-y plane. Various allotropes of perpendicularly oriented carbon rich regions can be classified into different groups based on the dimension of their crystal structures, such as zero-dimensional carbon (buckyballs), one-dimensional carbon (nanotubes), two-dimensional carbon (graphene) and three-dimensional carbon (diamond and graphite).

In another embodiment the process parameters in Table 5 can be used to laser convert (phase transform) a 1-3 atomic layer of silicon carbide substrate or region to graphene by scanning the laser beam primarily in the x-y plane. It is preferred that the laser is focused on the top surface by transmitting the laser beam through the substrate from the bottom surface.

In another embodiment graphene can be formed on the top surface of a wide bandgap material substrate that transmits a laser beam from the bottom surface where the top surface is in intimate contact with a graphite carbon precursor that is gaseous, liquid or solid. 1-3 layers of graphene are embedded in or deposited on the top surface of the wide bandgap material substrate by primarily scanning the laser beam in the x-y direction. Materials can be embedded, doped, alloyed, and/or deposited on or in wide bandgap materials, metals and polymers in this laser processing manner if processing temperatures do not exceed the melting or sublimation point of the substrate. This method is derived from the process presented in the paper "Laser Direct-Metallization of Silicon Carbide without Metal Deposition" I. A. Salama, A. Kar and N. R. Quick, Mat. Res. Soc. Symp., Proc. Vol 764, 2003 Materials Research Society, See FIG. 3. where conductive tracks are created perpendicular from a bottom surface by laser irradiation through the material from a top surface to this bottom surface and translating the laser beam in the +z direction.

FIG. 34 is a listing of the thermal conductivity of various materials. The thermal conductivity of silicon carbide is three times greater than the thermal conductivity of silicon. Referring back to FIG. 25, the silicon carbide material 10J formed in situ within a first region 61J of the silicon material 20J enhances the thermal conductivity between the first and the second regions 61J and 62J of the substrate 60J for dissipating from the second region 61J of the substrate 20J.

Figure 35A:
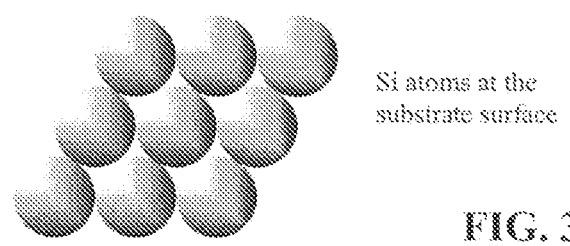
FIG. 35A is a representation of silicon Si atoms at the surface of a substrate.
Figure 35B:
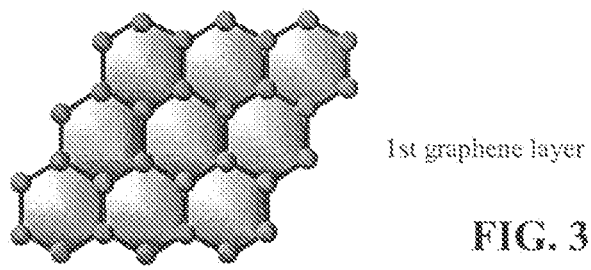
FIG. 35B is a representation similar to FIG. 35A illustrating a first grapheme layer on the surface of a substrate.

FIGS. 35A-35 is a representation of silicon Si atoms at the surface of a substrate with a first grapheme layer and a second grapheme layer on the surface of a substrate. Carbon rich surface and embedded regions, particularly graphene, can be created using multiphoton photolytic laser processing on or in silicon where low temperatures are required and the elimination of catalyst which can become contaminants is desired.

The materials combination of graphene and silicon prohibits the use of high temperature deposition because the melting temperature of Si is 1683° K versus the carbon deposition temperature range 1500°-2600° K. These lower temperatures 1500-2000° K use catalysts which will contaminate the graphene layer. This method is applicable to other graphene-semimetal, graphene-metal, graphene-polymer and graphene-wide bandgap material combinations.

Figure 35C:
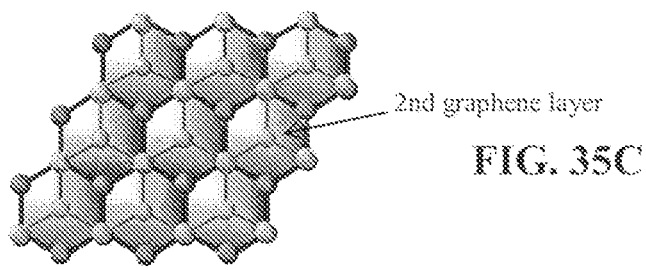
FIG. 35C is a representation similar to FIG. 35B illustrating a second grapheme layer on the surface of a substrate.

A frequency doubled Nd:YAG laser is used for multiphoton (e.g., two-photon) photolytic decomposition of methane to produce carbon atoms. This wavelength corresponds to a photon of energy 2.33 eV. The energy of two photon will be 4.66 eV, which lies within the range of the binding energy (4.3-4.85 eV) of a single C—H bond in $CH_4$. Currently frequency doubled Nd:YAG (green) lasers are available at high output powers, 100 W in cw (continuous wave) mode, which can be focused to very high intensities in order to induce multiphoton absorption only at the focal point. This method provides a mechanism to control the dissociation of $CH_4$ in order to produce carbon atoms only near the gas-substrate surface interface and consequently the formation of a carbon plane with carbon-carbon bonds in a hexagonal array. A typical graphene layer consists of 1-3 carbon (graphene) planes. FIG. 35C shows a typical array of Si atoms and two graphene planes.

This two-photon method is an improvement over single photon methods where the C—H bonds can break in the gaseous medium as well as at the gas-substrate interface, which leads to uncontrolled deposition of carbon atoms on the substrate. The carbon layer is expected to be a polycrystalline carbon film with numerous crystalline defects.

The energy required for forming the graphene plane is in the range of 6.34-7.38 eV/atom. This is a fairly large amount of energy and it explains why graphite is formed at very high temperatures in non-catalytic processes. Since thermal energy represents the random motions of atoms, only a small fraction of the laser thermal (pyrolytic) energy is utilized to form ordered phases and the rest of the energy leads to the formation of disordered phases with defects and random orientations of crystalline planes. The energy necessary to form the C—C bonds needs to be supplied to the atoms more efficiently and in a controlled manner by bond engineering using laser polarization.

Since lasers are electromagnetic waves, a high intensity laser beam generates an enormous amount of electric field. The direction of this electric field is given by the polarization of the laser beam. The laser beam is shaped to effect the polarization in a certain direction in order to apply the laser electric field to the carbon atoms in desired directions. Two or more laser beams with polarizations in different directions are for this purpose. In addition, since the energy of a photon of the green laser is much higher than the bandgap of Si, the laser will excite electrons from the valence bond to the conduction bond. This process creates an excess electron population at the substrate surface near the laser beam and modifies the substrate surface potential, resulting in an electrostatic field. This field contributes to the energy required for forming the C—C bonds. Thus the Si substrate behaves as a catalyst to facilitate the graphene formation.

Figure 36:
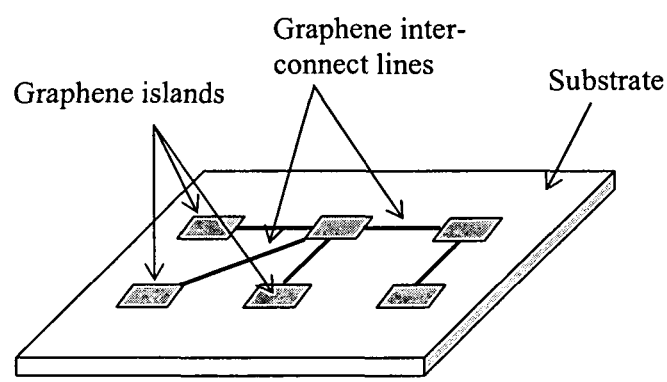
FIG. 36 is an isometric view of grapheme islands located on a substrate.

FIG. 36 is an isometric view of graphene islands located on a substrate. The present invention can be used to deposit graphene at isolated spots on the substrate surface so that the graphene islands can be used for fabricating devices such as transistors, diodes and capacitors. This technology can also be used to deposit graphene lines as interconnects among these islands. Preferably, excess graphene creates the required islands and lines.

The methane gas is contained in an absorption cell and a 532 nm wavelength (green) laser beam is focused on the gas-substrate interface to a very high intensities to induce multiphoton absorption. The intensity at the inlet ($I_i$) and outlet ($I_o$) of the cell is measured as a function of the gas pressure. These data are plotted as ln ($I_o/I_i$) versus gas pressure. The slope of this plot is the absorption coefficient. A straight line (linear) plot indicates single photon absorption and a nonlinear plot indicates multiphoton absorption. This technique enables the determination of the laser intensity and gas pressure for multiphoton photolytic laser chemical vapor deposition; the production of pure carbon for deposition on silicon.

Raman and FTIR spectroscopy are used for in situ analysis using a chamber with two line of sight windows. A wireless remote chemical sensor is also used that correlates changes in refractive index to chemical changes. This latter technology is the subject of our patent application Ser. No. 11/340,883.

The present invention provides a process for forming a wide bandgap material within a non-wide bandgap substrate to enhance the thermal conductivity and heat dissipation of the substrate. A thermal conducting material may be formed in situ within a wide bandgap material to enhance further the thermal conductivity and heat dissipation thereof. The formation of the wide bandgap material and/or the thermal conducting material in situ creates a continuous or diffuse boundary as opposed to a discrete boundary and matches the coefficient of thermal expansion of the prior art.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for synthesizing graphene, comprising the steps of:
   providing a substrate;
   focusing a laser beam in the presence of a carbon doping gas to induce two photon photolytic decomposition of the carbon doping gas only near the gas-substrate surface interface at the laser focal point to produce a plane of atomic carbon with carbon-carbon bonds in a hexagonal array; and
   continuing focusing the laser beam to photolytically react the carbon with the substrate to grow graphene.

2. A method for synthesizing graphene, comprising the steps of:
   providing a silicon substrate;
   focusing a laser beam in the presence of a carbon doping gas to induce two photon photolytic decomposition of the carbon doping gas only near the gas-silicon substrate surface interface at the laser focal point to produce a plane of atomic carbon with carbon-carbon bonds in a hexagonal array; and
   continuing focusing the laser beam to photolytically react the carbon with the silicon substrate to grow graphene.

3. A method for synthesizing graphene as set forth in claim 2 wherein a frequency doubled Nd:YAG laser produces a 532 nm wavelength to create two-photon absorption in silicon to limit temperature below the melting point of silicon.

4. A method for synthesizing graphene as set forth in claim 2 wherein the laser radiation-silicon interaction catalyzes the silicon for carbon chemisorption.

5. A method for synthesizing graphene as set forth in claim 2 wherein the graphene is limited to 3 planes of hexagonically oriented carbon.

6. A method for synthesizing graphene as set forth in claim 2 wherein the step of focusing the laser beam includes focusing the laser beam on portion of the silicon substrate to create islands and connecting lines of grapheme on the surface of the silicon substrate.

7. A method of forming graphene, comprising the steps of providing a silicon carbide substrate transparent to 532 nm wavelength;
   immersing a top surface of the silicon carbide substrate in carbon containing doping gas; and
   focusing a 532 nm laser from a bottom surface to the top surface of the silicon carbide substrate to photolytically decompose the carbon on the top surface of the silicon carbide substrate growing graphene on the top surface of the silicon carbide substrate.

8. A method for synthesizing graphene as set forth in claim 7 wherein the graphene is limited to 3 planes of hexagonically oriented carbon.

9. A method of forming graphene, comprising the steps of:
   providing a wide bandgap substrate transparent to 532 nm wavelength;
   immersing a top surface of the wide bandgap substrate in carbon containing doping gas; and
   focusing a 532 nm laser from a bottom surface to the top surface of the wide bandgap substrate to photolytically decompose the carbon on the top surface of the wide bandgap substrate growing graphene on the top surface of the wide bandgap substrate.

* * * * *